United States Patent [19]
McCallum et al.

[11] Patent Number: 6,093,337
[45] Date of Patent: Jul. 25, 2000

[54] MATERIAL FOR MAGNETOSTRICTIVE SENSORS AND OTHER APPLICATIONS BASED ON FERRITE MATERIALS

[75] Inventors: R. William McCallum; John E. Snyder; Kevin W. Dennis; Carl R. Schwichtenberg; David C. Jiles, all of Ames, Iowa

[73] Assignee: Iowa State University Research Foundation, Inc., Ames, Iowa

[21] Appl. No.: 09/164,981

[22] Filed: Oct. 1, 1998

[51] Int. Cl.$^7$ .................................................. C22C 29/12
[52] U.S. Cl. .................................... 252/62.55; 252/62.57; 252/62.56; 252/62.62; 252/62.63; 501/126; 75/234; 75/233; 75/247; 75/246
[58] Field of Search .................... 501/126; 75/234, 75/233, 247, 246; 252/62.55, 62.57, 62.62, 62.63, 62.36

[56] References Cited

U.S. PATENT DOCUMENTS

| | | | |
|---|---|---|---|
| 2,754,172 | 7/1956 | Went et al. | 23/51 |
| 2,951,042 | 8/1960 | Esveldt et al. | 252/62.56 |
| 3,502,584 | 3/1970 | Denes | 252/62.55 |
| 3,634,742 | 1/1972 | Edson | 318/118 |
| 3,753,058 | 8/1973 | Edson | 318/118 |
| 3,882,507 | 5/1975 | Trimble et al. | 346/74.1 |
| 3,940,992 | 3/1976 | Jost et al. | 73/370 R |
| 4,033,791 | 7/1977 | Kaczkowski | 140/31.55 |
| 4,033,929 | 7/1977 | Fischbeck et al. | 364/140 R |
| 4,068,527 | 1/1978 | Jost et al. | 73/704 |
| 4,104,549 | 8/1978 | Akimoto et al. | 252/62.55 |
| 4,126,723 | 11/1978 | Huntt | 420/357 |
| 4,151,432 | 4/1979 | Akimoto et al. | |
| 4,170,498 | 10/1979 | Jost et al. | 148/121 |
| 4,177,438 | 12/1979 | Vittoria | 333/152 |
| 4,289,987 | 9/1981 | Russell et al. | 310/26 |
| 4,414,510 | 11/1983 | Milkovic | 324/252 |
| 4,809,111 | 2/1989 | Zieren | 360/125 |
| 4,896,544 | 1/1990 | Garshelis | 73/862.36 |
| 4,935,263 | 6/1990 | Satoh et al. | 427/126.1 |
| 4,960,651 | 10/1990 | Pettigrew et al. | 428/607 |
| 5,117,321 | 5/1992 | Nakanishi et al. | 148/304 |
| 5,153,368 | 10/1992 | Fogle, Jr. | 102/202.2 |
| 5,302,306 | 4/1994 | Nagata et al. | 252/62.62 |
| 5,421,915 | 6/1995 | Nakanishi et al. | 360/120 |
| 5,442,966 | 8/1995 | Hase et al. | 73/62.33 |
| 5,565,830 | 10/1996 | Sahashi et al. | 335/215 |
| 5,576,912 | 11/1996 | Mitsumata et al. | 360/103 |
| 5,650,719 | 7/1997 | Moody et al. | 324/207.12 |
| 5,652,394 | 7/1997 | Sugino et al. | 73/729 |
| 5,694,038 | 12/1997 | Moody et al. | 324/207.2 |
| 5,729,130 | 3/1998 | Moody et al. | 324/166 |

*Primary Examiner*—C. Melissa Koslow
*Attorney, Agent, or Firm*—Fitch, Even, Tabin & Flannery

[57] ABSTRACT

The present invention provides magnetostrictive compositions that include an oxide ferrite which provides mechanical properties that make the magnetostrictive compositions effective for use as sensors and actuators.

9 Claims, No Drawings

MATERIAL FOR MAGNETOSTRICTIVE SENSORS AND OTHER APPLICATIONS BASED ON FERRITE MATERIALS

STATEMENT REGARDING FEDERALLY SPONSORED RESEARCH

This invention was made with Government support under contract number W-7405-Eng-82 awarded by the Department of Energy. The Government has certain rights in this Invention.

FIELD OF THE INVENTION

The present invention relates to magnetostrictive compositions which are effective for use as magnetostrictive sensors and actuators. More particularly, the magnetostrictive compositions include an oxide ferrite which provides mechanical properties that make the compositions effective for use in a wide variety of applications.

BACKGROUND OF THE INVENTION

The magnetic properties of many ferromagnetic materials undergo changes with stress. For example, the magnetic induction of nickel-iron alloys and iron-cobalt alloys increases and that of nickel decreases with tension stress. Conversely, if these metals are subject to magnetic fields, their dimensions can change. These magnetostrictive effects, including the Joule effect (change in length when a ferromagnetic rod is placed in a longitudinal field) and the Villari effect (change in magnetic condition when a magnetized ferromagnetic rod is subjected to longitudinal stress), can be used for converting electrical power to mechanical power and vice versa. Examples of the use ferromagnetic materials include sensors (U.S. Pat. Nos. 4,414,510 and 5,442,966), transducers (U.S. Pat. No. 3,753,058), and vibrators (U.S. Pat. No. 4,151,432). These types of sensors have low sensitivity ('966 patent) or measure applied magnetic field ('510 patent) rather than stress.

There has been considerable interest in using the magnetomechanical effect in sensors where stress is converted into a change in the magnetization of the magnetostrictive material. Any change in magnetization can be sensed without making contact to the sample. Such a sensor would be ideal for measuring torque in a rotating shaft such as in a drive train or power steering application. There is significant incentive to develop such a torque sensor for power steering applications as the parasitic losses associated with the hydraulic pump in current power steering systems is relatively large. For example, an electronic based system will result in a five percent decrease in fuel consumption.

Terfenol (commercially available as Terfenol D from Edge Technologies, Ames, IA), which is an alloy of terbium, iron and dysprosium, is an excellent magnetostrictive material, however, it has a number of shortcomings. For most applications, Terfenol is not economically viable as a result of the high costs of terbium and dysprosium. Further, in order to obtain optimal results a single crystal is required. As a rare earth intermetallic, Terfenol is extremely brittle and the high content of rare earth metal makes the material extremely susceptible to corrosion.

Other compounds such as nickel and maraging steel have also been considered for use as magnetostrictive material. Nickel has good corrosion resistance and moderate costs, but has only moderate magnetostriction. Maraging steel has a lower magnetostriction than nickel and is lower in cost, but requires carefully controlled heat treatment to produce optimum magnetostriction.

Attempts have been made to use oxide ferrites as magnetostrictive vibrators (U.S. Pat. No. 4,151,432). For example, the '432 patent describes a macroscopically homogenous sintered ferrite structure that is $Fe_3O_4$ to $Fe_2O_{4.1}$ either alone or in combination with $Fe_2O_3$. These types of compositions have been found to be unsuitable for use in brazing.

It is an object of the present invention to provide magnetostrictive compositions which are effective for use as magnetostrictive sensors and actuators.

It is another object of the invention to provide magnetostrictive compositions with good corrosion resistance and mechanical properties.

SUMMARY OF THE INVENTION

The present invention is directed to magnetostrictive compositions which are effective for use as magnetostrictive sensors and actuators. The magnetostrictive compositions of the invention have excellent corrosion resistance and mechanical properties that make them useful in a number of applications, including their use as sensors in the automotive industry. Further, the magnetostrictive compositions of the invention provide economic advantages over other material used as sensors.

In an important aspect of the invention, the magnetostrictive composition includes an oxide ferrite having a density of at least about 80% of its maximum theoretical density. In another important aspect, the magnetostrictive composition is effective for providing a magnetostriction of at least about 10 to about 400 ppm and is effective for providing a material that has a fracture strength of at least about 10 KSI (kilopounds per square inch). The oxide ferrite of the invention has the general formula $Me_xFe_yO_4$, wherein x is about 0.04 to about 1.3 and y is about 2 to about 3.

In another aspect of the invention, the magnetostrictive composition is a ceramic metallic composite. The ceramic metallic composite includes an oxide ferrite and a metallic binder in amounts effective to provide a ceramic metallic composite having a density of at least about 70% of its maximum theoretical density. In another important aspect, the magnetostrictive composition is effective for providing a magnetostriction of at least about 10 to about 400 ppm and is effective for providing a material that has a fracture strength of at least about 10 KSI.

In a very important aspect of the invention, the volume ratio of oxide ferrite to metallic binder is about 1:1 to about 99:1. The metallic binder is an alloy that does not result in removal of an amount of oxygen from the oxide ferrite ceramic that would degrade or reduce magnetostrictive properties, but which acts to wet the ceramic. Metallic binders useful in the present invention may include compounds having the general formula $Ag_{1-x}Ni_x$, $Ag_{1-x}Co_x$, where x is about 0.001 to about 0.6, $Ag_{1-x-y}Ni_xCo_y$, where x+y is about 0.001 to about 0.6, or binders of the general formula plus other metallic additions which total less than about 50 weight percent. The alloys useful in the present invention have a melting point between about 900° C. and about 1400° C. and may include silver/nickel, silver/cobalt, silver/copper/nickel, and silver/copper/zinc/nickel.

In another aspect of the invention, the ceramic metallic composite may further include a hard magnetic powder such as a hard ferrite. Examples of hard ferrites include compounds of the following composition,

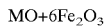

where M is barium, strontium or a combination of the two. In this aspect of the invention, the ceramic metallic composite may include from about 1 to about 50 weight percent hard magnetic powder, based on the weight of the ceramic metallic composite.

The present invention further provides a method for producing magnetostrictive compositions. In an important aspect of the invention, metal oxides are blended to form an oxide ferrite having a particle size of about 0.1 to about 50 microns. Metal oxides useful in the present invention may include cobalt oxide, iron oxide, manganese oxide, titanium oxide, zinc oxide and mixtures thereof.

In an alternative aspect, the present invention provide a method for producing a ceramic metallic composite. In an important aspect of the invention, metal oxides are blended and reacted to form an oxide ferrite. The oxide ferrite is blended with a metallic binder and shaped into a desired shape. The shaped blend is heated to about 600° C. to about 1200° C. in air for about 1 to about 30 minutes to provide a finished ceramic metallic composite.

DETAILED DESCRIPTION

Definitions

As used herein, the terms "magnetostrictive" and "magnetostrictive materials" refer to materials in which the dimensions of the material change when a magnetic field is applied. Typically this is a volume conserving transformation with the dimension along the direction of the applied field either expanding (positive magnetostriction) or contracting (negative magnetostriction). The dimensions perpendicular to the applied field change in the opposite sense to that along the field so that the volume of the sample is conserved. Alternatively, when a magnetostrictive material is placed under stress, a change in magnetic field results. The resulting change in magnetic field, referred to as a magnetomechanical effect, may be used a sensor in various applications.

As used herein, "maximum theoretical density" refers to a value obtained by averaging the theoretical densities of the component phases based on volume percent. The theoretical density of each component phase is taken to be the x-ray density, that is the density calculated from the crystalline lattice parameters as determined by x-ray diffraction.

As used herein, "fracture strength" refers to a value obtained by using a standard four point bend test as known in the art.

Oxide Ferrite Compounds

Oxide Ferrite compounds useful in the present invention include compounds having the general formula $Me_xFe_yO_4$, where Me is Mn, Co, Ti, Zn and mixtures thereof; x is about 0.04 to about 1.3; and y is about 2 to about 3. In a very important aspect of the invention, the oxide ferrite includes compounds such as $CoFe_2O_4$ (cobalt ferrite), $Mn_xFe_yO_4$, $Mn_xCo_{x1}Fe_2O_4$, $Co_xZn_{x1}Fe_2O_4$, $Ti_xFe_{y1}^{2+}Fe_{y2}^{3+}O_4$, and the like, and mixtures thereof, where x and y are defined as indicated above, x1 is about 0 to about 1.2, y1 is about 1 to about 1.5, and y2 is about 1.6 to about 2.3.

In an important aspect of the invention, the oxide ferrite compound when used alone provides a density of at least about 80% of its maximum theoretical density or when the oxide ferrite is used in combination with a metallic binder, about 70% of its maximum theoretical density. The density provides the composition with the structural integrity to withstand environments that it might be used in. For densities lower than 70% responses generated by the composition degrade as stress is dissipated in the increased void space.

Metallic Binder

Metallic binders useful in the present invention include alloys which have a melting point between about 900° C. and about 1400° C. In an important aspect, the metallic binder melts in an oxidizing atmosphere and is capable of wetting the oxide ferrite, but at the same time does not undergo extensive reaction with the oxide ferrite.

Hard Magnetic Powder

In an alternative aspect of the invention, the composition may further include a hard magnetic powder. The hard magnetic powder provides an internal bias field, eliminating the need for an externally applied bias field.

The following examples illustrate methods for carrying out the invention and should be understood to be illustrative of, but not limiting upon, the scope of the invention which is defined in the appended claims.

EXAMPLES

Example 1

Preparation of Cobalt Ferrite

Commercially available oxides of $Fe_2O_3$ and $CoO$ were mixed in the following weight percentages, 68.063 weight % $Fe_2O_3$ and 31.937 weight % $CoO$. The mixed oxides were calcined in dry air at about 900° C. for about 2 hours. The calcined mix was then micro milled in a dry nitrogen atmosphere and further fire micro milled powder in dry air at about 1100° C. for 24 hours. The fired powder was then ground by hand to provide a fine powder

EXAMPLE 2

Preparation of Ceramic Metallic Composite

Cobalt ferrite from Example 1 was mixed with metallic binder as indicated in the Table below. After mixing the metallic binder and cobalt ferrite, the powder was cold pressed into a pellet. The cold pressed powder was put into an alumina crucible and the crucible was put into a furnace at about 1450° C. in air for about 10 minutes. The crucible was removed from the furnace and allowed to quench at room temperature.

The magnetostriction was measured on cylindrical samples positioned with the applied magnetic field parallel to the cylindrical axis. A standard commercial strain gauge was glued to the surface of the sample so as to measure strain along the cylindrical axis. A commercial strain gauge meter was used and the field was determined with a commercial hall probe.

Results were as follows.

| Metallic Binder | Amount of binder/cobalt ferrite (vol %) | Maximum Magnetostriction (PPM) |
| --- | --- | --- |
| 97/3 wt % Ag Ni | 2/98 | −233 |
| 50/50 wt % Ag Ni | 2/98 | −195 |
| 10/90 wt % Ag Ni | 2/98 | −167 |
| Ni | 1/99 | −155 |
| Ni | 2/98 | −75 |
| Ni | 5/95 | −20 |
| Co | 2/98 | −80to −85 |
| Co | 1/99 | −155to−200 |
| Ag | 3/97 | −200 |
| Ag | 2/97 | −170 |
| Ag | 1/99 | −175 |

Numerous modifications and variations in practice of the invention are expected to occur to those skilled in the art upon consideration of the foregoing detailed description of the invention. Consequently, such modifications and variations are intended to be included within the scope of the following claims.

What is claimed is:

1. A ceramic metallic composite comprising a oxide ferrite and a metallic binder in a volume ratio of oxide ferrite to metallic binder of about 1:1 to about 99:1, wherein the oxide ferrite is selected from the group consisting of $CoFe_2O_4$, $Mn_xFe_yO_4$, $Mn_xCo_{x1}Fe_2O_4$, $Co_xZn_{x1}Fe_2O_4$, $Ti_xFe_{y1}{}^{2+}Fe_{y2}{}^{3+}O_4$, and mixtures thereof, wherein x is about 0.04 to about 1.3, y is about 2 to about 3, x1 is 0 to about 1.2, y1 is about 1 to about 1.5, and y2 is about 1.6 to about 2.3, wherein the metallic binder is selected from the group consisting of $Ag_{1-x}Ni_x$, $Ag_{1-x}Co_x$, where x is about 0.001 to about 0.6, $Ag_{1-x-y}Ni_xCo_y$, where x+y is about 0.001 to about 0.6, or binders of the general formulas $Ag_{1-x}Ni_x$, $Ag_{1-x}Co_x$, and $Ag_{1-x-y}Ni_xCo_y$, plus other metallic additions which total less than about 50 weight percent, the ceramic metallic composite having a density of at least about 70% of its theoretical maximum density and an amplitude of magnetostriction of at least about 10 to about 400 ppm, and wherein the ceramic metallic composite has a fracture strength of at least about 10 KSI.

2. A ceramic metallic composite according to claim 1 further comprising a hard magnet powder.

3. A ceramic metallic composite according to claim 2 wherein the hard magnetic powder is a hard ferrite having the general formula $MO+6Fe_2O_3$ where M is barium, strontium or mixtures thereof.

4. A method for producing a ceramic metallic composite comprising:

blending metal oxides to form an oxide ferrite having a particle size of about 0.1 to about 50 microns;

blending the oxide ferrite with a metallic binder;

forming the oxide ferrite and metallic binder blend into a desired shape; and heating the shaped blend at about 600° C. to about 1200° C. in air for about 1 to about 30 minutes.

5. A method according to claim 4 wherein blending of metal oxides is effective for forming an oxide ferrite having the general formula $Me_xFe_yO_4$, wherein Me is Mn, Co, Ti, Zn and mixtures thereof and x is about 0.04 to about 1.3 and y is about 2 to about 3.

6. A method according to claim 4 wherein the metallic binder is selected from the group consisting of $Ag_{1-x}Ni_x$, $Ag_{1-x}Co_x$, where x is about 0.001 to about 0.6, $Ag_{1-x-y}Ni_xCo_y$, where x+y is about 0.001 to about 0.6, or binders of the general formulas $Ag_{1-x}Ni_x$, $Ag_{1-x}Co_x$, and $Ag_{1-x-y}Ni_xCo_y$, plus other metallic additions which total less than about 50 weight percent.

7. A method according to claim 4 wherein the composite has an oxide ferrite to metallic binder volume ratio of about 1:1 to about 99:1.

8. A method according to claim 4 which further comprises blending from about 1 to about 50 weight percent, based on the weight of the ceramic metallic composite, of a hard magnetic powder with the oxide ferrite and metallic binder.

9. A method according to claim 8 wherein the hard magnetic powder is a hard ferrite having the general formula $MO+6Fe_2O_3$ where M is barium, strontium or mixtures thereof.

* * * * *